United States Patent
Liao et al.

(10) Patent No.: US 11,068,778 B2
(45) Date of Patent: Jul. 20, 2021

(54) SYSTEM AND METHOD FOR OPTIMIZING THE DESIGN OF CIRCUIT TRACES IN A PRINTED CIRCUIT BOARD FOR HIGH SPEED COMMUNICATIONS

(71) Applicant: DELL PRODUCTS, LP, Round Rock, TX (US)

(72) Inventors: Chun-Li Liao, Taipei (TW); Bhyrav M. Mutnury, Round Rock, TX (US); Ching Huei (Carol) Chen, Pingtun (TW); Nick Lee, Taipei (TW)

(73) Assignee: Dell Products L.P., Round Rock, TX (US)

( * ) Notice: Subject to any disclaimer, the term of this patent is extended or adjusted under 35 U.S.C. 154(b) by 1184 days.

(21) Appl. No.: 15/152,073

(22) Filed: May 11, 2016

(65) Prior Publication Data

US 2017/0330072 A1  Nov. 16, 2017

(51) Int. Cl.
*G06N 3/08* (2006.01)
*G06F 30/394* (2020.01)

(52) U.S. Cl.
CPC .............. *G06N 3/08* (2013.01); *G06F 30/394* (2020.01)

(58) Field of Classification Search
CPC .............................. G06N 3/08; G06F 17/5077
See application file for complete search history.

(56) References Cited

U.S. PATENT DOCUMENTS

| | | | | |
|---|---|---|---|---|
| 6,865,500 B1* | 3/2005 | Variyam | ................ | G01R 31/01 324/762.03 |
| 2003/0131323 A1* | 7/2003 | McConaghy | ....... | G06F 17/5063 716/102 |
| 2005/0257178 A1* | 11/2005 | Daems | ................ | G06F 17/5045 716/51 |
| 2007/0256046 A1* | 11/2007 | Pikus | .................. | G06F 17/5068 716/54 |

(Continued)

OTHER PUBLICATIONS

Cauwe et al., "Broadband Material Parameter Characterization for Practical High-Speed Interconnects on Printed Circuit Board", Aug. 2008, IEEE, pp. 649-656. (Year: 2008).*

(Continued)

*Primary Examiner* — Li B. Zhen
*Assistant Examiner* — Henry Nguyen
(74) *Attorney, Agent, or Firm* — Larson Newman, LLP

(57) ABSTRACT

A method includes training an artificial neural network with training data that comprises a sets of design parameter values for design parameters for circuit traces in a high speed communication link, determining an output formula that relates a sets of design parameters to a corresponding output parameter for the circuit traces in response to training the artificial neural network, running the output formula using a second set of design parameter values to obtain a corresponding set of output parameters for the circuit traces, determining that the corresponding set of output parameters differ from a set of modeled output parameters by less than a predefined percentage, and fabricating a circuit trace in a printed circuit board based upon the output formula in (Continued)

response to determining that the corresponding set of output parameters differ from the set of modeled output parameters by less than the predefined percentage.

15 Claims, 3 Drawing Sheets

(56) References Cited

U.S. PATENT DOCUMENTS

| | | | |
|---|---|---|---|
| 2009/0204376 A1* | 8/2009 | Keuth | G05B 19/401 703/6 |
| 2014/0282314 A1* | 9/2014 | Mohanty | G06F 17/5045 716/106 |
| 2014/0358526 A1* | 12/2014 | Abdelal | G10L 15/16 704/202 |
| 2015/0234972 A1 | 8/2015 | Ogawa et al. | |
| 2015/0286767 A1 | 10/2015 | Mai et al. | |
| 2015/0324507 A1 | 11/2015 | Takami | |

OTHER PUBLICATIONS

Kim et al., "Channel Design Methodology for 28Gb/s SerDes FPGA Applications with Stacked Silicon Interconnect Technology", 2012, IEEE, pp. 1786-1793 (Year: 2012).*

Udomboso, Christopher Godwin. "On Some properties of a hetereogeneous transfer function involving symmetric saturated linear (SATLINS) with Hyperbolic Tangent Sigmoid (TANSIG) transfer functions." Progress in Applied Mathematics 5.2 (2013): 40-47. (Year: 2013).*

Yonaba, H., F. Anctil, and V. Fortin. "Comparing sigmoid transfer functions for neural network multistep ahead streamflow forecasting." Journal of Hydrologic Engineering 15.4 (2010): 275-283. (Year: 2010).*

* cited by examiner

SYSTEM AND METHOD FOR OPTIMIZING THE DESIGN OF CIRCUIT TRACES IN A PRINTED CIRCUIT BOARD FOR HIGH SPEED COMMUNICATIONS

FIELD OF THE DISCLOSURE

This disclosure generally relates to information handling systems, and more particularly relates to optimizing the design of circuit traces in a printed circuit board for high speed communications.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

The design of circuit traces in a printed circuit board for high speed communications is an iterative process that relies heavily on the experience and intuition of the designer. Simulations of circuit traces requires accurate modeling and even simplified models can require extensive processing power and time to provide a useful design.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. The use of the same reference symbols in different drawings indicates similar or identical items. Embodiments incorporating teachings of the present disclosure are shown and described with respect to the drawings presented herein, in which.

SUMMARY

A method can include training an artificial neural network with training data that has sets of design parameter values for design parameters for circuit traces in a high speed communication link, determining an output formula that relates a sets of design parameters to a corresponding output parameter for the circuit traces in response to training the artificial neural network, running the output formula using a second set of design parameter values to obtain a corresponding set of output parameters for the circuit traces, determining that the corresponding set of output parameters differ from a set of modeled output parameters by less than a predefined percentage, and fabricating a circuit trace in a printed circuit board based upon the output formula in response to determining that the corresponding set of output parameters differ from the set of modeled output parameters by less than the predefined percentage. A computer-readable medium can include code to perform the method. An information handling system can operate to design circuit traces in accordance with the method.

DETAILED DESCRIPTION OF DRAWINGS

The following description in combination with the Figures is provided to assist in understanding the teachings disclosed herein, and will focus on specific implementations and embodiments of the teachings. This focus is provided to assist in describing the teachings, and should not be interpreted as limiting the scope or applicability of the teachings. Moreover, other teachings can be used along with the teachings of this disclosure, and the teachings of this disclosure can be used along with other disclosures.

Figure 1:
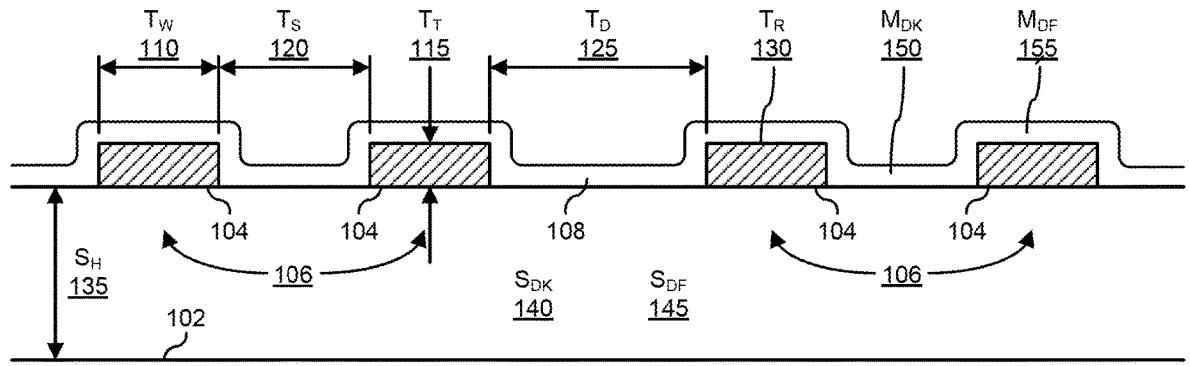
FIG. 1 is a cutaway view of a printed circuit board and circuit traces according to an embodiment of the present disclosure.

FIG. 1 illustrates a printed circuit board 100 including a substrate 102, one or more circuit traces 104, and a mask layer 108. Printed circuit board 100 represents an electronic circuit device that provides circuit connectivity between circuit components, such as integrated circuit devices, electrical or electronic components, or other electronic devices, and to which the circuit components are attached. Printed circuit board 100 can include multiple circuit layers that include circuit traces for carrying electrical power and electrical signals between the circuit components. Substrate 102 represents one such layer of printed circuit board 100, and can include insulating or semi-insulating materials, as needed or desired. An example of substrate 102 includes an FR4 glass-reinforced epoxy laminate material, an IS415 glass-reinforced epoxy laminate material, or another substrate material, as needed or desired.

Circuit traces 104 are provided on the surface of substrate 102. Circuit traces 104 represent conductive elements of printed circuit board 100 that provide the circuit connectivity between the circuit components of the electronic circuit device provided by the printed circuit board. As such, circuit traces 104 are made of a conducting material, such as copper, aluminum, gold, or another conducting material, as needed or desired. In the illustrated embodiment, circuit traces 104 are configured in trace pairs 106, Here, in a particular embodiment, a first trace can be considered as carrying an electrical signal, and the other circuit trace can be considered as providing a reference or ground plane for the electrical signal. This embodiment is typically called single-ended signaling. In another embodiment, the first trace can be considered as carrying a positive side of an electrical signal, and the second trace can be considered as carrying a negative side of the electrical signal. This embodiment is typically called differential signaling.

Mask layer 108 represents a material placed over the surface of printed circuit board 100 to protect the circuit elements of the printed circuit board, and to provide an insulating layer to the surface of the printed circuit board.

Printed circuit board 100 is characterized as having a particular design that relates various design parameters of the printed circuit board to the desired circuit performance of the printed circuit board. In the illustrated embodiment, the design parameters of printed circuit board 100 include a trace width ($T_W$) 110 and a trace thickness ($T_T$) 115 of traces 104, a trace spacing ($T_S$) 120 between the traces of a trace pair 106, a trace distance ($T_D$) 125 between trace pairs, a surface roughness ($T_R$) 130 of the traces, a height ($S_H$) 135 of substrate 102, a dielectric constant ($S_{DK}$) 140 and a loss tangent ($S_{DF}$) 145 of the substrate, and a dielectric constant ($M_{DK}$) 150 and a loss tangent ($M_{DF}$) 155 of mask layer 108. Each design parameter 110-155 is defined as a particular value that relates to a particular characteristic that can be varied as a matter of design choice or of process variability. For example, a designer may be able to select from one of five different values for each design parameter 110-155, as shown if Table 1, below.

TABLE 1

Design Parameters

| $T_W$ (mils) | $T_D$ | $T_S$ (mils) | $T_T$ (mils) | $T_R$ | $S_h$ (mils) | $S_{DK}$ | $S_{DF}$ | $M_{DK}$ | $M_{DF}$ |
|---|---|---|---|---|---|---|---|---|---|
| 3.0 | 3.00 | 7.0 | 1.00 | 1.0 | 2.0 | 2.8 | 0.030 | 3.00 | 0.002 |
| 4.5 | 4.75 | 8.5 | 1.35 | 3.0 | 4.0 | 3.0 | 0.035 | 3.35 | 0.008 |
| 6.0 | 7.50 | 10.0 | 1.70 | 5.0 | 6.0 | 3.2 | 0.040 | 3.70 | 0.014 |
| 7.5 | 9.25 | 11.5 | 2.05 | 7.0 | 8.0 | 3.4 | 0.045 | 4.05 | 0.020 |
| 9.0 | 12.00 | 13.0 | 2.40 | 9.0 | 10.0 | 3.6 | .0500 | 4.4 | 0.026 |

In a particular embodiment, the design is modeled to determine the effects of the different sets of design parameters 110-155 on one or more output parameters. An example of an output parameter includes channel impedance ($Z_0$), channel loss (L), near-end crosstalk ($XT_{NE}$), far-end crosstalk ($XT_{FE}$), or another output parameter, as needed or desired. Thus, to directly simulate the resulting output parameters for all possible combinations of design parameters 110-155 would require $5^{10}=9,765,625$ simulation runs to determine a best design, based upon a particular criteria for defining the best set of output parameters. In a particular embodiment, a simulation run requires 5-10 seconds to generate a modeled result. As such a design task of performing nearly 10 million simulation runs would require an inordinate amount of time to determine a best design.

Figure 2:
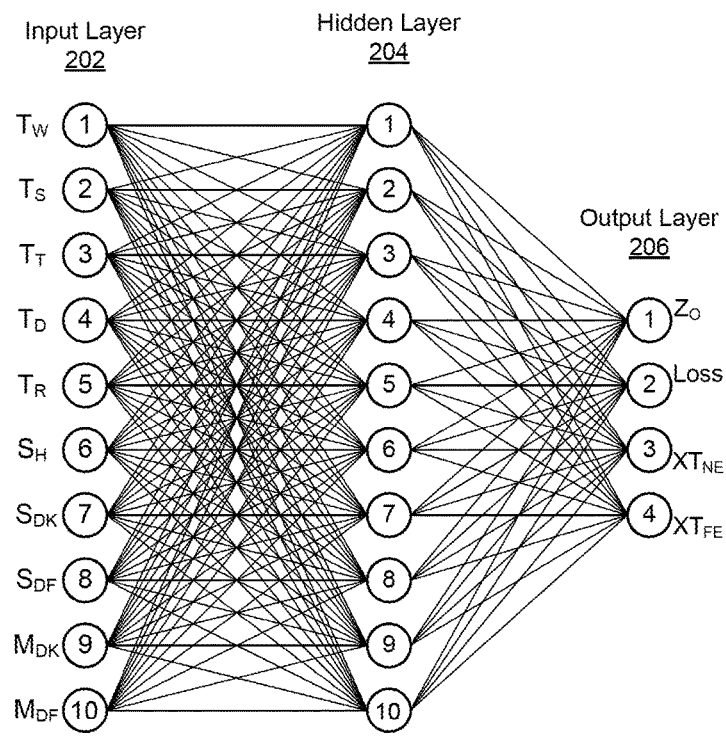
FIG. 2 is an illustration of an Artificial Neural Network for evaluating the design of circuit traces in a printed circuit board for high speed communications.

In a particular embodiment, shown in FIG. 2, an artificial neural network (ANN) 200 is trained to learn an output formula that relates design parameters 110-155 to the output parameters. More particularly, an input layer 202 including design parameters 110-155 is provided, and sets of the design parameter values are analyzed through a hidden layer 204 to provide a learned formula for each of the output parameters in an output layer 206. Each output parameter can be considered to be modeled by a separate 10-1 neural network with an output given as:

$$y = f(x) = \sum_{j=1}^{M} k_j * G\left(\sum_{i=1}^{N} w_{ij} x_i + b_j\right) + d \quad \text{Equation 1}$$

$$G(x) = \frac{2}{1 + e^{-2x}} - 1 \quad \text{Equation 2}$$

where N is the number of inputs, M is the number of hidden nodes, x is the input vector, $w_{ij}$ is the weight connecting the $i^{th}$ input layer node to the $j^{th}$ node, and $k_j$ is the weight connecting the $j^{th}$ hidden layer node to the output layer node. It will be understood that the design of ANN 200 can be chosen to optimize the modeling behavior, and that the number of hidden layers can be greater than one (1), and that the number of nodes in a particular hidden layer is not necessarily equal to ten (10) nodes, but can have a greater or lesser number of hidden layer nodes as needed or desired. Moreover, the interconnections between the nodes can be chosen as needed or desired to reflect the interactions between the input parameters and the output parameters.

In a particular embodiment, a d-optimal training algorithm is utilized in ANN 200 to intelligently reduce the number of sets of the design parameter values that are utilized to train the ANN. Here, ANN 200 is trained so as to maximize the determinant of the information matrix (X'X). An optimum number of sets of the design parameters can be chosen to train ANN 200. For example, where each of design parameters 110-155 have three possible values, giving a total number of possible sets of the design parameter values of $3^{10}=59,049$ sets, 560 sets of design parameter values can be selected for training ANN 200. In another embodiment, another training algorithm is utilized in in ANN 200 to intelligently reduce the number of sets of the design parameter values that are utilized to train the ANN. An example of other training algorithms include Radial Basis Functions (RBF), Surrogate Learning Models, Regression Models, or other training algorithms, as needed or desired.

Figure 3:
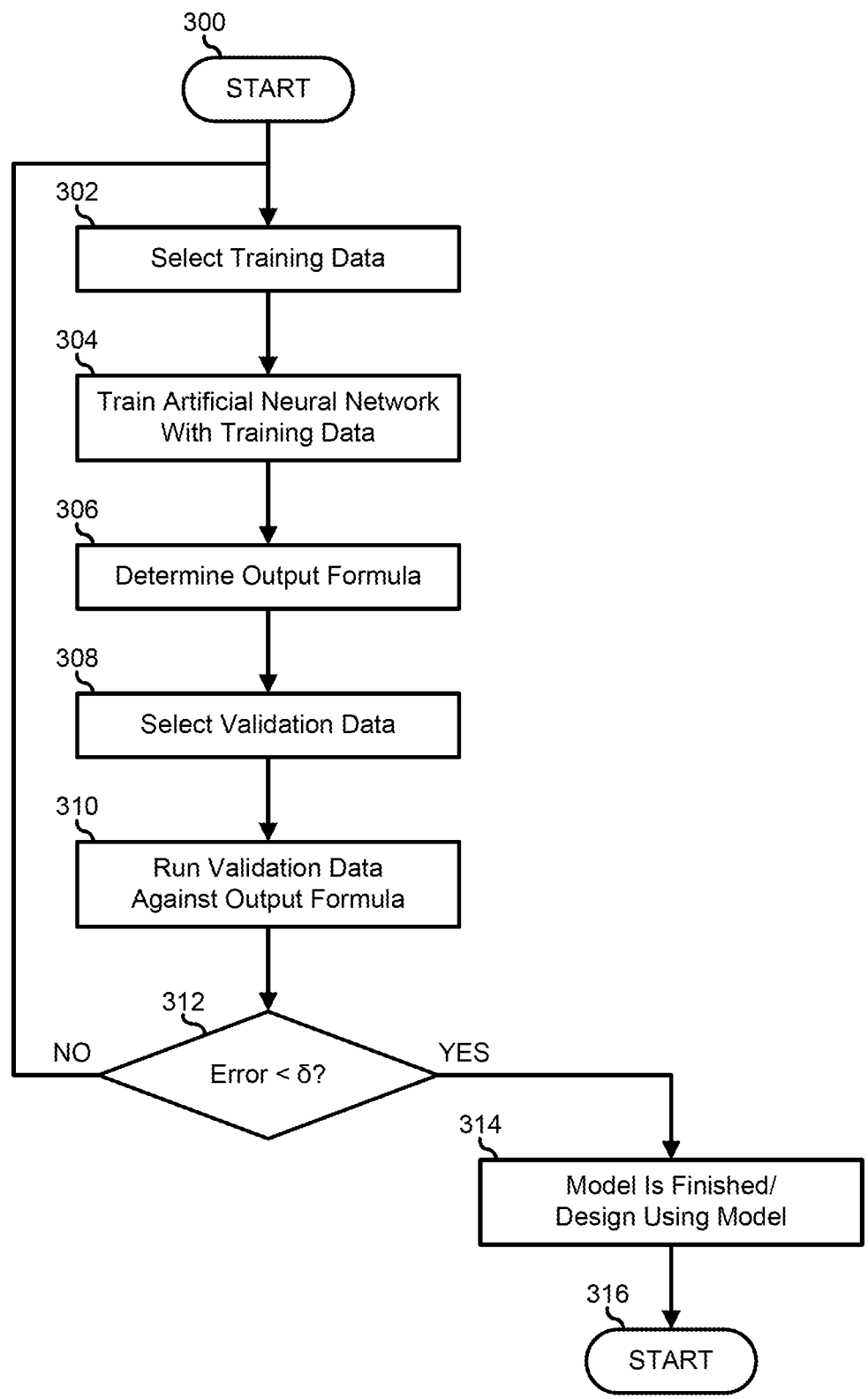
FIG. 3 is a flowchart illustrating a method for optimizing the design of circuit traces in a printed circuit board for high speed communications according to an embodiment of the present disclosure.

FIG. 3 shows a method for optimizing the design of circuit traces in a printed circuit board for high speed communications, starting at block 300. Training data for an artificial neural network is selected in block 302. For example, the design of circuit traces in a printed circuit board can be characterized by a number of design parameters, and each design parameter can be characterized by a number of design parameter values. In a particular embodiment, sets of the design parameter values can be selected based upon the design judgment of a designer, such as by selecting sets of design parameter values that reflect nominal cases for the design parameter values and that reflect corner cased for the design parameter values. In another embodiment, sets of the design parameter values can be selected based upon an optimal design type of selection criteria. In yet another embodiment, sets of the design parameter values can be selected randomly. Moreover, sets of the design parameter values can be selected based upon a combination of design judgment, an optimal design selection criteria, and random sets. In a particular embodiment, given ten (10) design parameters that each have three possible values, giving a total number of possible sets of the design parameter values of $3^{10}=59,049$ sets, 560 sets of design parameter values can be selected for training the artificial neural network.

The artificial neural network is trained utilizing the selected sets of the design parameter values in block 304. For example, a d-optimal training algorithm can utilized to train the artificial neural network, so as to maximize the determinant of the information matrix (X'X) of the selected sets of the design parameter values.

The training of the artificial neural network is performed to determine one or more output formulas for one or more output parameters in block 306. For example, where a design of circuit traces in a printed circuit board for high speed communications is characterized by a channel impedance, a channel loss value, a near-end crosstalk value, and a far-end crosstalk value, the artificial neural network may be trained to determine four (4) different formulas, one each for channel impedance, channel loss, near-end crosstalk, and far-end crosstalk, that each approximate the actual predicted values based upon the sets of the design parameter values.

Validation data for the artificial neural network is selected in block 308. For example, where 560 sets of design parameter values is selected for training the artificial neural network, an additional 200 different sets of design parameter values can be selected as validation data.

The validation data is provided to the one or more output formulas to verify the degree of accuracy of the output formulas. For example, a simulation run based upon the validation data sets of the design parameter values may result in simulated output parameters, and the validation data sets of the design parameter values may be applied to the one or more formulas that resulted from the training of the artificial neural network to provide modeled output parameters. Here, a design criteria of, for example a particular percentage ($\delta$), may be applied, such that, if the simulated output parameters and the modeled output parameters differ by less than the particular percentage ($\delta$), the formulas that resulted from the training of the artificial neural network can be said to be satisfactory to model the behavior of the modeled circuit traces.

A decision is made as to whether or not the formulas that resulted from the training of the artificial neural network are satisfactory to model the behavior of the modeled circuit traces, that is, that the simulated output parameters and the modeled output parameters differ by less than the particular percentage ($\delta$), in decision block 312. If not, the "NO" branch of decision block 312 is taken and the method returns to block 302 where new training data for an artificial neural network is selected. If the formulas that resulted from the training of the artificial neural network are satisfactory to model the behavior of the modeled circuit traces, the "YES" branch of decision block 312 is taken, the model is finished and the circuit traces are designed using the model in block 314, and the method ends in block 316.

The skilled artisan will recognize that the illustrated parameters are not exhaustive of the parameters that can be used to describe the design of a printed circuit board, that the illustrated parameters shown are exemplary, and that one or more additional parameters can be utilized in modeling circuit traces in a printed circuit board for high speed communications, as needed or desired.

Figure 4:
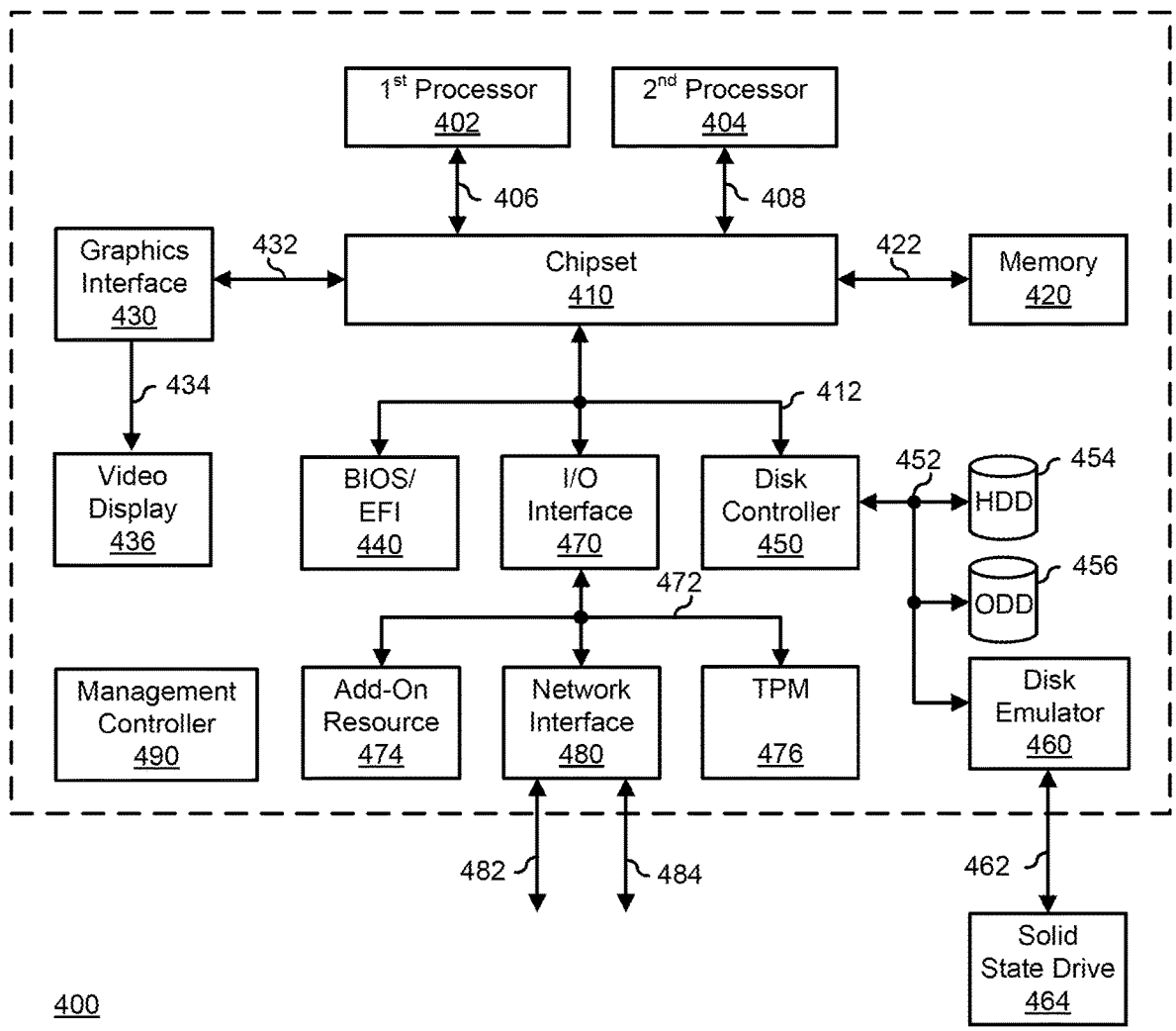
FIG. 4 is a block diagram illustrating a generalized information handling system according to an embodiment of the present disclosure.

FIG. 4 illustrates a generalized embodiment of information handling system 400. For purpose of this disclosure information handling system 400 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

Information handling system 400 can include devices or modules that embody one or more of the devices or modules described above, and operates to perform one or more of the methods described above. Information handling system 400 includes a processors 402 and 404, a chipset 410, a memory 420, a graphics interface 430, a basic input and output system/extensible firmware interface (BIOS/EFI) module 440, a disk controller 450, a disk emulator 460, an input/output (I/O) interface 470, a network interface 480, and a management controller 490. Processor 402 is connected to chipset 410 via processor interface 406, and processor 404 is connected to the chipset via processor interface 408. Memory 420 is connected to chipset 410 via a memory bus 422. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof. Graphics interface 430 is connected to chipset 410 via a graphics interface 432, and provides a video display output 434 to a video display 436.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474, to a trusted platform module (TPM) 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof. TPM 476 can include a dedicated crypto-processor and secure storage, to ensure the integrity of information handling system 400 and to detect and prevent tampering with the operating firmware of the information handling system.

Network interface 480 represents a NIC disposed within information handling system 400, on a main circuit board of the information handling system, integrated onto another component such as chipset 410, in another suitable location, or a combination thereof. Network interface 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management controller 490 provides for out-of-band monitoring, management, and control of the respective components of information handling system 400, such as cooling fan speed control, power supply management, hot-swap and hot-plug management, firmware management and update management for system BIOS or UEFI, Option ROM, device firmware, and the like, or other system management and control functions as needed or desired. As such, management system 490 provides some or all of the functions and features of the management systems described herein.

The preceding description in combination with the Figures is provided to assist in understanding the teachings disclosed herein. The preceding discussion focused on specific implementations and embodiments of the teachings. This focus has been provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method, comprising:

training an artificial neural network with first training data, wherein the first training data includes a first plurality of sets of design parameter values for a plurality of design parameters for circuit traces in a high speed communication link, wherein the artificial neural network provides an output given as:

$$y = f(x) = \sum_{j=1}^{M} k_j * G\left(\sum_{i=1}^{N} w_{ij} * x_i + b_j\right) + d, \text{ and } G(x) = \frac{2}{1 + e^{-2x}} - 1$$

where N is a number of inputs, M is a number of hidden nodes, x is an input vector, $w_{ij}$ is a weight connecting a $i^{th}$ input layer node to a $j^{th}$ hidden layer node, $k_j$ is a weight connecting the $j^{th}$ hidden layer node to an output layer node, and $b_j$, e and d are constants, wherein the training is based upon a d-optimal training algorithm, and wherein training the artificial neural network includes providing a particular one of the design parameters to an associated one of the inputs;

determining, in response to training the artificial neural network, an output formula that relates a particular set of the sets of design parameters to a corresponding output of the artificial neural network, wherein each output is associated with a particular output parameter for the circuit traces;

running the output formula using a second plurality of sets of design parameter values for the design parameters to obtain a corresponding set of output parameters for the circuit traces;

determining that the corresponding set of output parameters for the circuit traces differ from a set of modeled output parameters by less than a predefined percentage; and fabricating a circuit trace in a printed circuit board based upon the output formula in response to determining that the corresponding set of output parameters differ from the set of modeled output parameters by less than the predefined percentage;

wherein the design parameter values comprise:
  a trace width of a first trace and a second trace of a trace pair of the printed circuit board;
  a trace thickness of the first trace and the second trace;
  a trace spacing between the first trace and the second trace;
  a trace distance between the first trace pair and a second trace pair of the printed circuit board;
  a surface roughness of the first trace and the second trace;
  a height of a substrate of the printed circuit board;
  a dielectric constant of the substrate;
  a loss tangent of the substrate;
  a dielectric constant of a mask layer of the printed circuit board; and
  a loss tangent of the mask layer; and
wherein the output parameters comprise:
  a channel impedance of the first trace pair;
  a channel loss of the first trace pair;
  a near-end crosstalk of the first trace pair; and
  a far-end crosstalk of the first trace pair.

2. The method of claim 1, further comprising:
selecting the first training data, wherein training the artificial neural network is in response to selecting the first training data.

3. The method of claim 2, wherein in selecting the first training data, the method further comprises:
using an optimization model to determine a number of sets of design parameter values in the first plurality of sets of design parameter values.

4. The method of claim 1, wherein in training the artificial neural network, the method further comprises:
training the artificial neural network to maximize a determinant of an information matrix of the plurality of sets of the design parameter values.

5. The method of claim 1, further comprising:
training the artificial neural network with second training data, wherein the second training data comprises a second plurality of sets of design parameter values for the plurality of design parameters for the circuit traces in response to determining that the corresponding set of output parameters for the circuit traces does not differ from a set of modeled output parameters by less than a predefined percentage.

6. A non-transitory computer-readable medium including code for performing a method, the method comprising:
training an artificial neural network with first training data, wherein the first training data comprises a first plurality of sets of design parameter values for a plurality of design parameters for circuit traces in a high speed communication link, wherein the artificial neural network provides an output given as:

$$y = f(x) = \sum_{j=1}^{M} k_j * G\left(\sum_{i=1}^{N} w_{ij}, x_i + b_j\right) + d, \text{ and } G(x) = \frac{2}{1+e^{-2x}} - 1$$

where N is a number of inputs, M is a number of hidden nodes, x is an input vector, $w_{ij}$ is a weight connecting a $i^{th}$ input layer node to a $j^{th}$ hidden layer node, $k_j$ is a weight connecting the $j^{th}$ hidden layer node to an output layer node, and $b_j$, e and d are constants, wherein the training is based upon a d-optimal training algorithm, and wherein training the artificial neural network includes providing a particular one of the design parameters to an associated one of the inputs;

determining, in response to training the artificial neural network, an output formula that relates a particular set of the sets of design parameters to a corresponding output of the artificial neural network, wherein each output is associated with a particular output parameter for the circuit traces;

running the output formula using a second plurality of sets of design parameter values for the design parameters to obtain a corresponding set of output parameters for the circuit traces;

determining that the corresponding set of output parameters for the circuit traces differ from a set of modeled output parameters by less than a predefined percentage; and fabricating a circuit trace in a printed circuit board based upon the output formula in response to determining that the corresponding set of output parameters differ from the set of modeled output parameters by less than the predefined percentage;

wherein the design parameter values comprise:
  a trace width of a first trace and a second trace of a trace pair of the printed circuit board;
  a trace thickness of the first trace and the second trace;
  a trace spacing between the first trace and the second trace;
  a trace distance between the first trace pair and a second trace pair of the printed circuit board;
  a surface roughness of the first trace and the second trace;
  a height of a substrate of the printed circuit board;
  a dielectric constant of the substrate;
  a loss tangent of the substrate;
  a dielectric constant of a mask layer of the printed circuit board; and
  a loss tangent of the mask layer; and
wherein the output parameters comprise:
  a channel impedance of the first trace pair;
  a channel loss of the first trace pair;

a near-end crosstalk of the first trace pair; and
a far-end crosstalk of the first trace pair.

7. The computer-readable medium of claim 6, the method further comprising:
selecting the first training data, wherein training the artificial neural network is in response to selecting the first training data.

8. The computer-readable medium of claim 7, wherein in selecting the first training data, the method further comprises:
using an optimization model to determine a number of sets of design parameter values in the first plurality of sets of design parameter values.

9. The computer-readable medium of claim 6, wherein in training the artificial neural network, the method further comprises:
training the artificial neural network to maximize a determinant of an information matrix of the plurality of sets of the design parameter values.

10. The computer-readable medium of claim 6, the method further comprising:
training the artificial neural network with second training data, wherein the second training data comprises a second plurality of sets of design parameter values for the plurality of design parameters for the circuit traces in response to determining that the corresponding set of output parameters for the circuit traces does not differ from a set of modeled output parameters by less than a predefined percentage.

11. An information handling system, comprising:
a memory that stores code; and
a processor that executes code stored in memory to:
train an artificial neural network with first training data, wherein the first training data comprises a first plurality of sets of design parameter values for a design parameters for circuit traces in a high speed communication link, wherein the artificial neural network provides an output given as:

$$y = f(x) = \sum_{j=1}^{M} k_j * G\left(\sum_{i=1}^{N} w_{ij}, x_i + b_j\right) + d, \text{ and } G(x) = \frac{2}{1 + e^{-2x}} - 1$$

where N is a number of inputs, M is a number of hidden nodes, x is an input vector, $w_{ij}$ is a weight connecting a $i^{th}$ input layer node to a $j^{th}$ hidden layer node, $k_j$ is a weight connecting the $j^{th}$ hidden layer node to an output layer node, and $b_j$, e and d are constants, wherein the training is based upon a d-optimal training algorithm, and wherein training the artificial neural network includes providing a particular one of the design parameters to an associated one of the inputs;
determine, in response to training the artificial neural network, an output formula that relates a particular set of the sets of design parameters to a corresponding output of the artificial neural network, wherein each output is associated with a particular output parameter for the circuit traces;
run the output formula using a second plurality of sets of design parameter values for the plurality of design parameters to obtain a corresponding set of output parameters for the circuit traces;
determine that the corresponding set of output parameters for the circuit traces differ from a set of modeled output parameters by less than a predefined percentage; and
fabricate a circuit trace in a printed circuit board based upon the output formula in response to determining that the corresponding set of output parameters differ from the set of modeled output parameters by less than the predefined percentage;
wherein the design parameter values comprise:
a trace width of a first trace and a second trace of a trace pair of the printed circuit board;
a trace thickness of the first trace and the second trace;
a trace spacing between the first trace and the second trace;
a trace distance between the first trace pair and a second trace pair of the printed circuit board;
a surface roughness of the first trace and the second trace;
a height of a substrate of the printed circuit board;
a dielectric constant of the substrate;
a loss tangent of the substrate;
a dielectric constant of a mask layer of the printed circuit board; and
a loss tangent of the mask layer; and
wherein the output parameters comprise:
a channel impedance of the first trace pair;
a channel loss of the first trace pair;
a near-end crosstalk of the first trace pair; and
a far-end crosstalk of the first trace pair.

12. The information handling system of claim 11, wherein the processor is further to:
select the first training data, wherein training the artificial neural network is in response to selecting the first training data.

13. The information handling system of claim 12, wherein in selecting the first training data, the processor is further to:
use an optimization model to determine a number of sets of design parameter values in the first plurality of sets of design parameter values.

14. The information handling system of claim 11, wherein in training the artificial neural network, the processor is further to:
train the artificial neural network to maximize a determinant of an information matrix of the plurality of sets of the design parameter values.

15. The information handling system of claim 11, wherein the processor is further to:
train the artificial neural network with second training data, wherein the second training data comprises a second plurality of sets of design parameter values for the plurality of design parameters for the circuit traces in response to determining that the corresponding set of output parameters for the circuit traces does not differ from a set of modeled output parameters by less than a predefined percentage.

* * * * *